United States Patent [19]
Shin

[11] Patent Number: 5,483,493
[45] Date of Patent: Jan. 9, 1996

[54] MULTI-BIT TEST CIRCUIT OF SEMICONDUCTOR MEMORY DEVICE

[75] Inventor: Choong-Sun Shin, Incheon, Rep. of Korea

[73] Assignee: Samsung Electronics Co., Ltd., Suwon, Rep. of Korea

[21] Appl. No.: 343,948

[22] Filed: Nov. 17, 1994

[30] Foreign Application Priority Data

Nov. 17, 1993 [KR] Rep. of Korea ............... 24485/1993

[51] Int. Cl.$^6$ .................................................. G11C 7/00
[52] U.S. Cl. ............ 365/201; 365/189.02; 365/189.07
[58] Field of Search .......................... 365/201, 189.01, 365/189.02, 189.07; 371/21.1

[56] References Cited

U.S. PATENT DOCUMENTS

| | | | |
|---|---|---|---|
| 5,315,553 | 5/1994 | Morris | 365/201 |
| 5,321,651 | 6/1994 | Monk | 365/189.01 |
| 5,359,561 | 10/1994 | Sakomura et al. | 365/201 |
| 5,365,481 | 11/1994 | Sawada | 365/201 |

Primary Examiner—David C. Nelms
Assistant Examiner—Son Dinh
Attorney, Agent, or Firm—Cushman Darby & Cushman

[57] ABSTRACT

The present invention relates to a semiconductor memory device and more particularly to a multi-bit test circuit which is capable of testing a data access operation of a plurality of memory cells at the same time. A multi-bit test circuit of a semiconductor memory device according to the present invention includes a multiplexer for outputting data having the same logic level to a plurality of data buses at the same time, a first comparator for determining as to whether the data inputted from the data buses has the same logic level, a test controller for complementarily activating the multiplexer and the first comparator with combining a test enable signal and read/write signals, a plurality of data input/output lines commonly connected to one of the data buses through a writing path and a reading path, a second comparator for receiving logic levels of the data input/output lines, and a data input/output controller for connecting one of the writing path and the reading path of the data input/output lines to the data buses in a first operation mode, and for transmitting an output of the second comparator to the data buses.

2 Claims, 3 Drawing Sheets

MULTI-BIT TEST CIRCUIT OF SEMICONDUCTOR MEMORY DEVICE

FIELD OF THE INVENTION

The present invention relates to a semiconductor memory device and more particularly to a multi-bit test circuit which is capable of testing a data access operation of a plurality of memory cells at the same time.

BACKGROUND OF THE INVENTION

Generally, in a memory device for storing and reading data such as a dynamic random access memory device, there is installed a circuit for testing a data access operation of memory cell. As the time taken for testing the data access operation is more and more increased since the memory device has a large high integration, a multi-bit text circuit is required to test a plurality of memory cells at the same time. A conventional technique on such a multi-bit test circuit is disclosed in ISSCC (IEEE Journal of Solid State Circuits), Vol. 22, pp 647, 1987.

FIG. 1 is a schematic block diagram showing data input/output portion of the multi-bit test circuit according to the present invention.

Referring to FIG. 1, n data buses D1–Dn are commonly connected to a multiplexer MUX 12 and to a comparator 14, and a test controller 10 is provided for controlling the MUX 12 and the comparator 14. The test controller 10 is enabled by a test enable signal φFTE. The MUX 12 is activated when a write signal WRITE for designating a data writing operation is applied as the logic "high" level, whereas the comparator 14 is activated when a read signal READ for designating a data reading operation is applied as the logic "high" level. The MUX 12 and the comparator 14 are commonly connected to the data input/output ports. The MUX 12 transmits the inputted data to each of the data buses D1–Dn. The comparator 14 compares each logic level of data outputted through the data buses D1–Dn, and then determines whether all the logic levels are same, thereby outputting the determined results as an error flag. Reading and writing circuits connected to data I/O line of a memory cell array are provided to each of the data buses D1–Dn.

FIG. 2 is a circuit diagram illustrating conventional reading and writing circuits. Data bus Di (wherein i=1, 2, ... n) is commonly connected to a pair of data I/O lines I/O1 and I/O2. Each data I/O line is connected to the data bus Di by parallel connected a reading path and a writing path to each other. The reading path consists of an one-way buffer 16 and a pass transistor 18 for transmitting data from the data I/O line to the data bus Di. In the meanwhile, the writing path consists of an one-way buffer 20 and a pass transistor 22 for transmitting data from the data bus Di to the data I/O line. The gate terminal of the pass transistor 18 on the reading path of the data line I/O1 is controlled by an output from an AND gate 24 which is receiving the read signal READ and a complementary decoded column address signal $\overline{DAK}$. In the meanwhile, the gate terminal of the pass transistor 18 on the reading path of the data line I/O2 is controlled by an output from an AND gate 26 which is receiving the read signal READ and the decoded column address signal DAK. Hence, when the read signal READ is applied to the "high" level, one of a pair of data line I/O1 and I/O2 is connected to the data bus Di in accordance with the logic level of the decoded column address signal DAK.

Furthermore, the gate terminal of the pass transistor 22 on the writing path of the data line I/O1 is controlled by an output from an AND gate 28 which is receiving the write signal WRITE and the complementary decoded column address signal $\overline{DAK}$. In the meanwhile, the gate terminal of the pass transistor 22 on the writing path of the data line I/O2 is controlled by an output of an AND gate 30 which is receiving an write signal WRITE and the decoded column address signal DAK. Hence, when the write signal WRITE is applied as the "high" level, one of a pair of data line I/O1 and I/O2 is connected to the data bus Di in accordance with the logic level of the decoded column address signal DAK. When one signal of the write signal WRITE and read signal READ is in an activate state, the other signal of them is in a non-activate state.

An explanation on a conventional multi-bit test operation will be given hereinafter with respect to FIGS. 1 and 2. Referring to FIG. 1, the test enable signal φFTE for designating a test mode is applied as the "high" level, the write signal WRITE as the "high" level, and the read signal READ as the "low" level. Thereby, the multiplexer MUX 12 is activated and the comparator 14 is not activated. At this time, if data of the "high" level, for example, is inputted to the multiplexer MUX 12, the multiplexer MUX 12 sets data buses D1–Dn to be the "high" level. Referring to FIG. 2, as the read signal READ is in the "low" level, all the pass transistors 18 positioned on the reading paths of the data lines I/O1 and I/O2 are turned off, while as the write signal WRITE is in the "high" level, one of the pass transistors 22 positioned on the writing paths of the data lines I/O1 and I/O2 is turned on in accordance with the logic level of the decoded column address signal DAK.

For example, if the signal DAK is in the "low" level at the time, the data line I/O1 is connected to the data bus Di. As a result, data being at the "high" level in the data bus Di is transmitted to the data line I/O1 through the one-way buffer 20 and the pass transistor 22, and thereby the data of the "high" level is inputted to a bit line BL1 connected to the data line I/O1. On the other hand, if the signal DAK is changed from the "low" level to the "high" level, the data of the "high" level is inputted to a memory cell designated by a corresponding word line through a bit line BL2 connected to the data line I/O2, through the same process as the data line I/O1 mentioned above,. Since such a writing operation is performed in the reading and writing circuits respectively connected to the data buses D1–Dn, data of the "high" level is transmitted to all of n bit lines, thereby performing the writing operation to n memory cells at the same time.

After a predetermined time is passed, while performing the reading operation, the write signal WRITE is changed to the "low" level and at the same time, the read signal READ is changed to the "high" level. Accordingly, the MUX 12 is not activated and the comparator 14 is activated. Returning to FIG. 2, the pass transistors 22 positioned on the writing path of data lines I/O1 and I/O2 are turned off. Any one pass transistor of the pass transistors 18 positioned on the reading path of data lines I/O1 and I/O2 which has the signals DAK or $\overline{DAK}$ being at the "high" level is turned on, thereby enabling one of the data lines I/O1 and I/O2 to be connected to the data line Di. At this time, the data line Di is discharged or precharged to a predetermined potential. The memory cell data read through the bit line is transmitted to the data lines I/O1 or I/O2 and is then transmitted to the data bus Di through the reading path. Thereafter, the comparator 14 compares the logic level of data and outputs the results to the error flag. Since such all reading operations are performed in the data buses D1–Dn, the number of data inputted to the comparator 14 is n read out from the n memory cells. Hence, the data reading and writing operation can be performed from/in the n memory cells at the same time. Under the JEDEC standards, the number of data to be tested at the same time in, for example, 64M DRAM is set as 32 bits.

However, there is a case where a testing operation is required for a large number of bits at the same time, in order to meet the requirement for decrement of time taken for testing the data access operation after manufacturing the memory device. In other words, if a user is to test data of 32 bits or 64 bits at the same time, there is a disadvantage in that the conventional technique of FIG. 2 can not perform a testing operation for the number of such data bits.

SUMMARY OF THE INVENTION

An object of the present invention is to provide a multi-bit test circuit which can perform testing operations of a first bit number and a second bit number having more bits than the first bit number.

According to an aspect of the present invention, there is provided a multibit test circuit of a semiconductor memory device which is capable of testing data access operation of a plurality of memory cells at the same time. A multi-bit test circuit of a semiconductor memory device according to the present invention includes a multiplexer for outputting data having the same logic level to a plurality of data buses at the same time, a first comparator for determining as to whether the data inputted from the data buses has the same logic level, a test controller for complementarily activating the multiplexer and the first comparator with combining a test enable signal and read/write signals, a plurality of data input/output lines commonly connected to one of the data buses through a writing path and a reading path, a second comparator for receiving logic levels of the data input/output lines, and a data input/output controller for connecting one of the writing path and the reading path of the data input/output lines to the data buses in a first operation mode, and for transmitting an output of the second comparator to the data buses in a second mode of operation.

BRIEF DESCRIPTION OF DRAWING

A more complete appreciation of the inventions, and many of the attendant advantages thereof, will be readily enjoyed as the same becomes better understood by reference to the following detailed description when considered in conjunction with the accompanying drawings in which like numbers indicate the same or similar components, wherein.

DETAILED DESCRIPTION OF THE PREFERRED EMBODIMENTS

Figure 3:
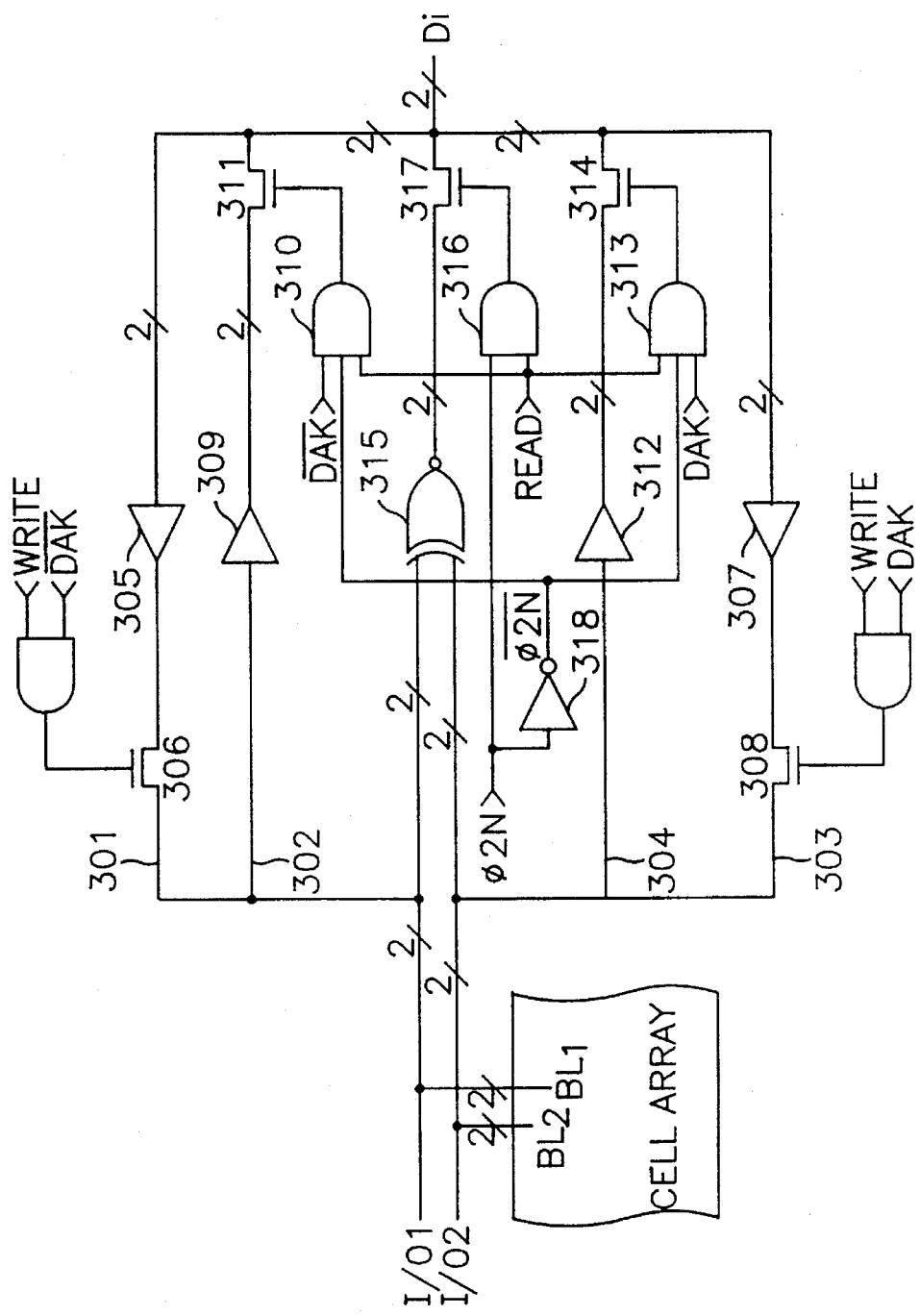
FIG. 3 is a detailed circuit diagram illustrating the multi-bit test circuit according to the present invention.

FIG. 3 is a detailed circuit diagram illustrating the writing and reading circuits of the multi-bit test circuit according to the present invention, in which a pair of the data I/O lines I/O1 and I/O2 connected to a pair of bit lines BL1 and BL2 of a memory cell array are depicted, respectively.

The pair of the data I/O lines I/O1 and I/O2 are commonly connected to the data bus Di, wherein the data line I/O1 is connected by a writing path 301 and a reading path 302 connected parallel to each other, and the data line I/O2 by a writing path 303 and a reading path 304 connected parallel to each other. The writing path 301 of the data line I/O1 is comprised of an one-way buffer 305 which transmits the data on the data bus Di to the data line I/O1, and a pass transistor 306 whose gate is controlled by a logical-AND of a write signal WRITE and a complementary decoded column address signal $\overline{DAK}$. On the other hand, the writing path 303 of the data line I/O2 is comprised of an one-way buffer 307 which transmits the data on the data bus Di to the data line I/O2, and a pass transistor 308 whose gate is controlled by a logical-AND of the write signal WRITE and a decoded column address signal DAK. Therefore, if the write signal WRITE is applied to the "high" level, the pass transistors 306 and 308 are complementarily turned on in accordance with the logic level of the decoded column address signal DAK. As a result, one of the data lines I/O1 an I/O2 receives data from the data bus Di. In the meanwhile, the reading path 302 of the data line I/O1 is comprised of an one-way buffer 309 which transmits the data on the data line I/O1 to the data bus Di, and a pass transistor 311 whose gate is controlled by the output of an AND gate 310 having three input lines. On the other hand, the reading path 304 of the data line I/O2 is comprised of an oneway buffer 312 which transmits the data on the data line I/O2 to the data bus Di, and a pass transistor 314 whose gate is controlled by the output of an AND gate 313 having three input lines. The AND gate 310 receives the read signal READ, the complementary decoded column address signal $\overline{DAK}$, and an inverted 2N test mode designating signal $\overline{\phi 2N}$. The AND gate 313 receives the read signal READ, the decoded column address signal DAK, and the inverted 2N test mode designating signal $\overline{\phi 2N}$. Thus, if the read signal READ and a 2N test mode designating signal $\phi 2N$ are applied to the "low" levels, the pass transistors 311 and 314 are complementarily turned on in accordance with the logic level of the decoded column address signal DAK. As a result, one of the data lines I/O1 and I/O2 transmits data to the data bus Di.

In the meanwhile, in the figure, an exclusive NOR gate 315 for receiving data on the data lines I/O1 and I/O2, and a pass transistor 317 connected between the output of the exclusive NOR gate 315 and the data bus Di and whose gate terminal is controlled by the logical AND of the read signal READ and the 2N test mode designating signal $\phi 2N$. The exclusive NOR gate 315 serves as a comparator which compares the logic levels of the inputted data. If the 2N test mode designating signal $\phi 2N$ is at the "high" level and the read signal READ is also at the "high" level, the pass transistor 317 is turned on and the output of the exclusive NOR gate 315 is then transmitted to the data bus Di.

Figure 1:
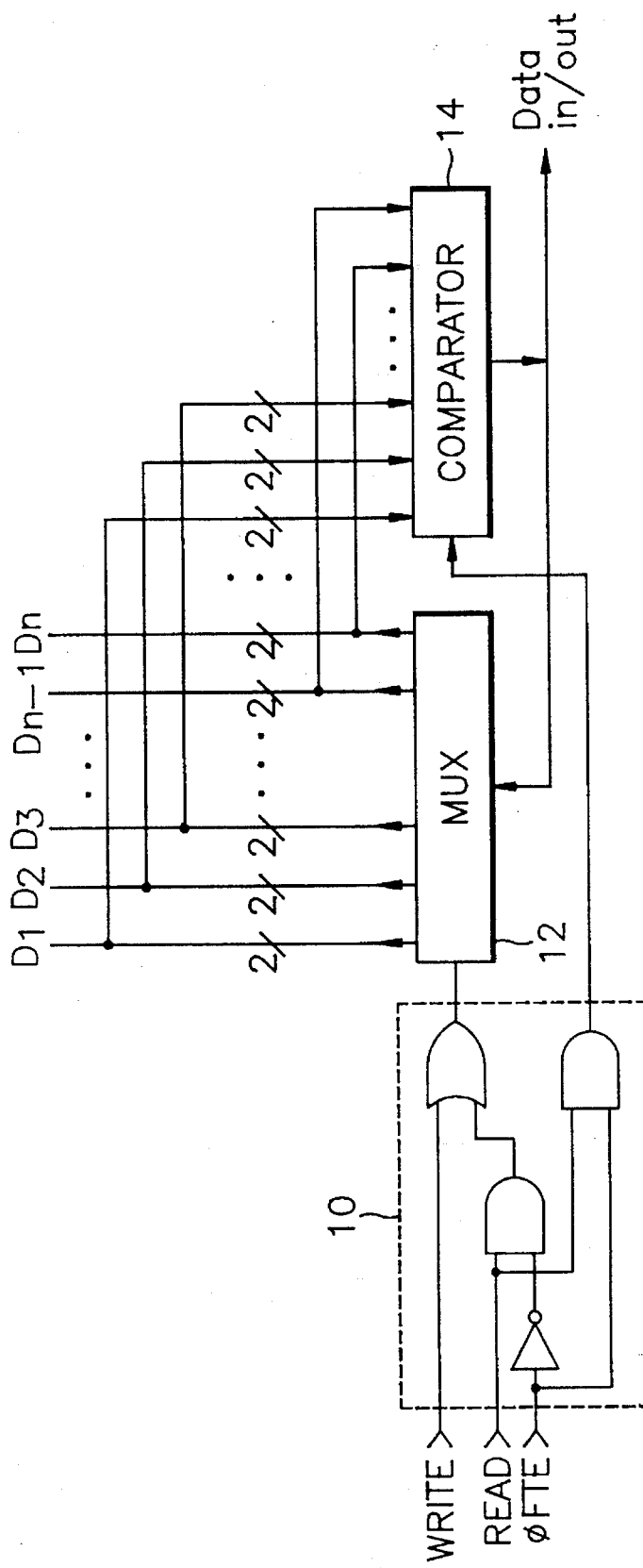
FIG. 1 is a schematic block diagram showing data input/output ports of the multi-bit test circuit according to the present invention.
Figure 2:
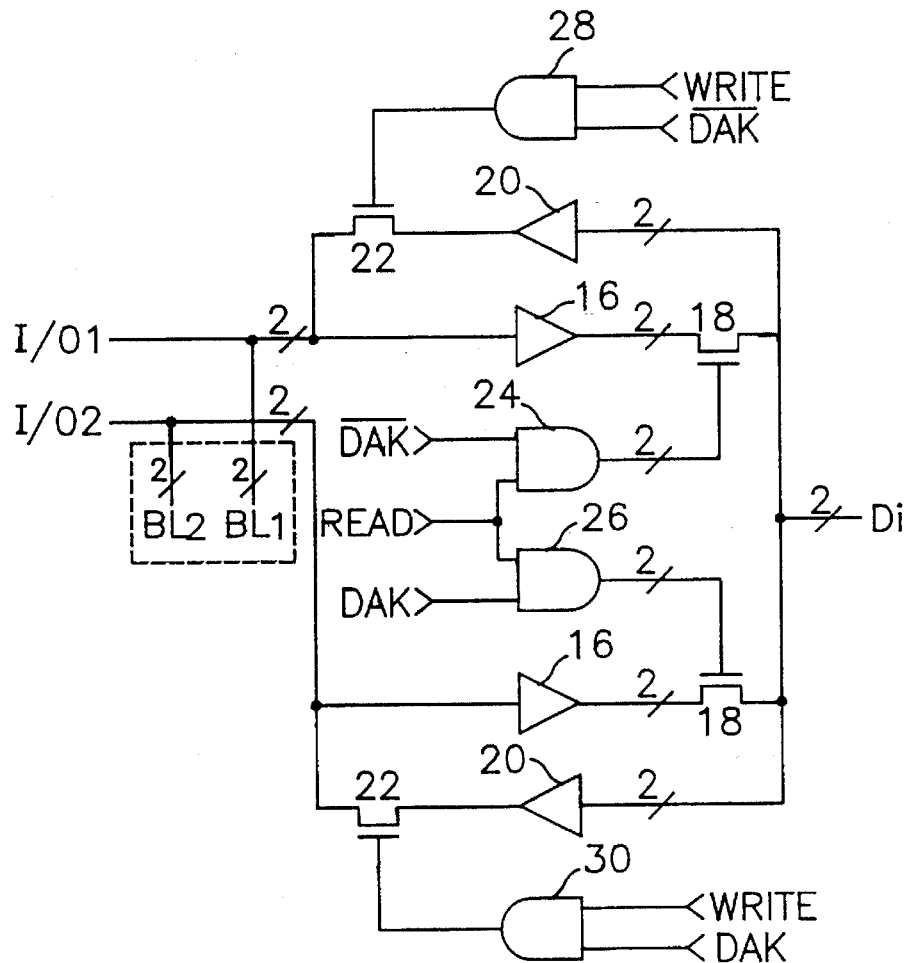
FIG. 2 is a detailed circuit diagram illustrating a conventional multi-bit test circuit.

An overall operation of FIG. 3 will be explained hereinafter. Firstly, if the 2N test mode designating signal $\phi 2N$ is at the "low" level, the output of the AND gate 316 is at the "low" level, thereby enabling the pass transistor 317 to be turned off. Thereafter, the output of the exclusive NOR gate 315 is cut off. Further, the inverted 2N test mode designating signal $\overline{\phi 2N}$ generated by the inverter 318 becomes in the "high" level. At the time, the multi-bit test mode is performed in the same manner as FIG. 2. As a result, it can be determined whether a normal data access operation is executed by the last error flag outputted from the comparator 14 shown in FIG. 1.

Figure 4:
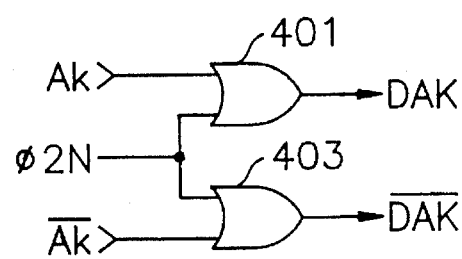
FIG. 4 is a control circuit diagram in which all decoded column address signals are outputted in a "high" level according to the present invention.

On the other hand, if the 2N test mode designating signal φ2N is at the "high" level, the output of the AND gate 316 is at the "high" level, thereby enabling the pass transistor 317 to be turned on. Thereafter, the output of the exclusive NOR gate 315 is transmitted to the data bus Di. Further, as the inverted 2N test mode designating signal $\overline{\phi 2N}$ generated by the inverter 318 becomes in the "low" level, the pass transistors 311 and 314 which controls the data bus Di and the reading paths of the data lines I/O1 and I/O2 are turned off. While performing the test operation, a specific data, for example, the data of the "high" level is transmitted on the data bus Di, and the write signal WRITE is applied to the "high" level. At the time, since the decoded column address signals DAK and $\overline{DAK}$ are at the "high" level, as shown in FIG. 4, the data of the "high" level is simultaneously transmitted to the data lines I/O1 and I/O2 and is inputted to the corresponding memory cell through the bit line. After passing a predetermined time, the write signal WRITE is changed to the "low" level and simultaneously the read signal READ is changed to the "high" level. Then, the output of the AND gate 316, which performs the logical-AND of the 2N test mode designating signal φ2N applied to the "high" level and the read signal READ, is at the "high" level, thereby enabling the pass transistor 317 to be turned on. At the time, the data read out from the memory cell is transmitted on the data lines I/O1 and I/O2 and the exclusive NOR gate 315 compares the data. If the logic levels of the data are same, the output of the exclusive NOR gate 315 is at the "high" level and then transmitted to the data bus Di.

Returning now to FIG. 1, the data transmitted on each data bus is compared in the comparator 14 activated by the read signal READ, then it is determined whether the data is in the same level or not in the same level due to the failure of the data access operation. At the time, since the data transmitted on each data bus results from the data on the data lines I/O1 and I/O2 and a total number of data buses is n, it is accordingly appreciated that the output of the comparator results from the compression of data of 2N bits. Hence, the multi-bit test of N bits or 2N bits is designated by the 2N test mode designating signal φ2N, wherein a user can freely choose any one of the two test modes.

In the preferred embodiment of FIG. 3, in the writing mode, in order not to care the effect of the decoded column address signal DAK, a control circuit is depicted in FIG. 4 so that the output of all the decoded column address signals DAK becomes in the "high" level. Referring to FIG. 4, an OR gate 401 outputting the decoded column address signal DAK receives a column address signal Ak and the 2N test mode designating signal φ2N, while an OR gate 403 outputting the inverted decoded column address signal $\overline{DAK}$ receives the column address signal Ak and the 2N test mode designating signal φ2N. Accordingly, when the 2N test mode designating signal φ2N is applied to the "high" level, the outputs of the signals DAK and $\overline{DAK}$ are in the "high" level.

As previously described, a multi-bit test circuit according to the present invention which can perform testing operations of a first bit number and a second bit number having more bits than the first bit number.

What is claimed is:

1. A multi-bit test circuit of a semiconductor memory device comprising:

a multiplexer for outputting data having the same logic level to a plurality of data buses at the same time;

a first comparator for determining as to whether said data inputted from said data buses has the same logic level;

a test controller for complementarily activating said multiplexer and said first comparator with combining a test enable signal and read/write signals;

a plurality of data input/output lines commonly connected to one of said data buses through a writing path and a reading path;

a second comparator for receiving logic levels of said data input/output lines; and a data input/output controller for connecting one of said writing path and said reading path of said data input/output lines to said data buses in a first operation mode, and for transmitting an output of said second comparator to said data buses in a second mode of operation.

2. The multi-bit test circuit as claimed in claim 1, wherein said second operation mode performs an input/output operation for bits of 2 times as many as the number of bits in said first operation mode.

* * * * *